(12) United States Patent
Zhai et al.

(10) Patent No.: US 8,790,610 B2
(45) Date of Patent: Jul. 29, 2014

(54) METHOD OF FORMING COMPOSITE MATERIALS INCLUDING CONJUGATED MATERIALS ATTACHED TO CARBON NANOTUBES OR GRAPHENES

(71) Applicant: University of Central Florida Research Foundation, Inc., Orlando, FL (US)

(72) Inventors: Lei Zhai, Oviedo, FL (US); Jianhua Liu, Orlando, FL (US); Jianhua Zou, Orlando, FL (US); Anindarupa Chunder, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 14/077,711

(22) Filed: Nov. 12, 2013

(65) Prior Publication Data

US 2014/0072704 A1    Mar. 13, 2014

Related U.S. Application Data

(63) Continuation-in-part of application No. 13/015,170, filed on Jan. 27, 2011, now Pat. No. 8,613,898.

(60) Provisional application No. 61/299,129, filed on Jan. 28, 2010.

(51) Int. Cl.
*B82Y 30/00* (2011.01)
*B82Y 40/00* (2011.01)

(52) U.S. Cl.
USPC ....... 423/445 R; 423/460; 977/746; 977/748; 977/847

(58) Field of Classification Search
USPC ....... 423/445 R, 445 B, 446, 447.1–448, 460; 977/734–753, 842–848
See application file for complete search history.

(56) References Cited

U.S. PATENT DOCUMENTS

| | | |
|---|---|---|
| 2004/0034177 A1 | 2/2004 | Chen |
| 2007/0131915 A1 | 6/2007 | Stankovich et al. |
| 2009/0118420 A1 | 5/2009 | Zou et al. |
| 2009/0143515 A1 | 6/2009 | Herrera-Alonso et al. |
| 2009/0235988 A1 | 9/2009 | Jenekhe et al. |
| 2010/0065829 A1 | 3/2010 | Forrest et al. |
| 2011/0052813 A1 | 3/2011 | Ho et al. |
| 2011/0162687 A1 | 7/2011 | Moon et al. |

OTHER PUBLICATIONS

Jianhua Zou, et al., "Ultralight Multiwalled Carbon Nanotube Aerogel", ACS Nano, vol. 4, No. 12, pp. 7293-7302. American Chemical Society.

Pei-Tzu Wu, et al., "Regioregular Poly (3-pentylthiophene): Synthesis, Self-Assembly of Nanowires, High-Mobility Field-Effect Transistors, and Efficient Photovoltaic Cells", Macromolecules 2009, vol. 42, pp. 8817-8826, Oct. 26, 2009.

(Continued)

*Primary Examiner* — Mark Tornow
*Assistant Examiner* — Eric Ward
(74) *Attorney, Agent, or Firm* — Jetter & Associates, P.A.

(57) ABSTRACT

A method of forming composite materials includes dispersing a conjugated material, a solvent for the conjugated material, and a plurality of carbon nanotubes (CNTs) or graphene including structures having an outer surface to form a dispersion. The solvent is evaporated from the dispersion to yield a CNT or graphene composite including a plurality of crystalline supramolecular structures having the conjugated material non-covalently secured to the outer surface of the CNT or the graphene including structure. The supramolecular structures have an average length which extends outward in a length direction from the outer surface of the CNT or graphene including structure, where the average length is greater than an average width of the supramolecular structures.

20 Claims, 5 Drawing Sheets

(56) References Cited

OTHER PUBLICATIONS

Wentao Xu, et al., "Solvent-Induced Crystallization of Poly (3-dodecylthiophene): Morphyology and Kinetics", J. Phys. Chem. B, May 4, 2011, vol. 115, pp. 6412-6420, ACS Publications, 2011 American Chemical Society.

Bing Li, et al., "Alternating patterns on single-walled carbon nanotubes", Nature Nanotechnology, vol. 4, pp. 358-362, Apr. 26, 2009.

Anindarupa Chunder, et al., "Reduced Graphene Oxide/Copper Phthalocyanine Composite and its Optoelectrical", American Chemical Society, J. Phys. Chem. C, Aug. 18, 2010, vol. 114, pp. 15129-15135.

METHOD OF FORMING COMPOSITE MATERIALS INCLUDING CONJUGATED MATERIALS ATTACHED TO CARBON NANOTUBES OR GRAPHENES

CROSS REFERENCE TO RELATED APPLICATIONS

This application is a continuation-in-part of U.S. Non-Provisional patent application Ser. No. 13/015,170 filed Jan. 27, 2011, entitled "SUPRAMOLECULAR STRUCTURES COMPRISING AT LEAST PARTIALLY CONJUGATED POLYMERS ATTACHED TO CARBON NANOTUBES OR GRAPHENES", now U.S. Pat. No. 8,613,898, which claims priority to Provisional Application Ser. No. 61/299,129 entitled "SUPRAMOLECULAR STRUCTURES COMPRISING AT LEAST PARTIALLY CONJUGATED POLYMERS ATTACHED TO CARBON NANOTUBES OR GRAPHENES" filed Jan. 28, 2010, both of which are herein incorporated by reference in their entirety.

STATEMENT REGARDING FEDERALLY SPONSORED RESEARCH

This invention was made with Government support under Agency contract Career Award DMR 0746499 awarded by the National Science Foundation. The Government has certain rights in this invention.

FIELD

Disclosed embodiments relate to methods of forming composite materials comprising arrangements comprising conjugated materials attached to carbon allotropes including graphene comprising materials or carbon nanotubes.

BACKGROUND

Two carbon allotropes, carbon nanotubes (CNTs) and graphene, have attracted significant attention due to their remarkable mechanical, thermal, and electrical properties. In theory, the in-plane electrical conductivity of metallic single wall CNTs can be 1,000 times higher as compared to both silver and copper, and the tensile strength of a multiwalled CNT is expected to be in the range of 10-100 GPa. The potential applications of CNTs extend from nanoelectronics, to sensors, energy storage devices (fuel cells, batteries, and supercapacitors), photovoltaics, biomolecular imaging and detection, thermal management, and conductive nanocomposite.

Graphene is a flat monolayer of carbon atoms tightly packed into a two dimensional (2D) honeycomb lattice. Electrons in graphene behave like massless relativistic particles, which contributes to very peculiar properties such as an anomalous quantum Hall effect and the absence of localization. Graphene has demonstrated a variety of intriguing properties including high electron mobility at room temperature (15,000 cm$^2$/V·s) and superior mechanical properties (Young's modulus is 500 GPa.). Its potential applications range from single molecule gas detection, transparent conducting electrodes and field-effect devices to energy storage devices such as supercapacitors and lithium ion batteries.

The effective utilization of CNTs and graphenes in composites and devices depends strongly on the ability to disperse them homogeneously in solvents and the matrix, and to functionalize their surfaces with target functional groups. However, it is challenging to achieve stable CNT and graphene dispersions in solvent media, as well as to functionalize their surfaces. The as-produced CNTs have a strong tendency to bundle together, and similarly graphenes tend to exist in the form of a graphite due to strong van der Waals interactions.

Surface modification of CNT and graphene with small molecules or polymers is one way to attempt to increase their solubility and provide desired functionalities. The surface modification generally involves attaching functional groups to CNT/graphene surfaces through the formation of covalent bonds (covalent approaches) or non-covalent bonds (non-covalent approaches). Although the covalent approach is generally effective in functionalizing CNTs and graphenes, the covalent bonding disrupts the long range π conjugation of the CNT, leading to degraded electrical properties and diminished mechanical strength.

In contrast, non-covalent approaches can utilize multiple weak interactions such as π-π interactions, van der Waals interactions, and static charge interactions. Such non-covalent interactions avoid damage to the chemical structure, and allows the CNT or graphene to retain their electrical and mechanical properties. However, although significant effort has been invested in this pursuit, the commercial application of CNTs and graphene is still extremely limited, mainly due to the lack of a simple and versatile system to disperse and functionalize CNTs and graphenes.

SUMMARY

Disclosed embodiments include methods of forming composite materials including supramolecular structures having at least partially conjugated materials attached to carbon nanotubes (CNTs) or graphenes. A conjugated material is dispersed with a solvent for the conjugated material together with a plurality of CNTs or graphene including structures having an outer surface to form a dispersion. The solvent is evaporated from the dispersion to yield a CNT or graphene composite material including a plurality of at least partially crystalline supramolecular structures having the conjugated material non-covalently secured to the outer surface of the CNT or the graphene including structure. The supramolecular structures have an average length which extends outward in a length direction from the outer surface of the CNT or graphene including structure, where the average length is greater than an average width of the supramolecular structures.

Other disclosed embodiments include composite materials that include at least one CNT or a graphene comprising structure having an outer surface, and a plurality of at least partially crystalline supramolecular structures that include a conjugated material non-covalently secured to the outer surface of the CNTs or the graphene comprising structure. The conjugated material can be a conjugated homopolymer, a block copolymer that includes at least one conjugated block, a conjugated oligomer, or a conjugated non-polymeric or oligomeric material such as pentacene, tetracene, or hexacene, pyrene, perylene or porphyrine and similar compounds. The supramolecular structures extend outward from the outer surface of the CNTs or graphene comprising structures.

Disclosed embodiments include electronic device comprising a plurality of electrodes, wherein a disclosed composite material is between the electrodes. In another embodiment, supramolecular structures provide a gate/channel region that connects to CNT arrays or graphene comprising structures that provide the source and drain electrodes to realize an organic field effect transistor (FET).

DETAILED DESCRIPTION

Figure 1:
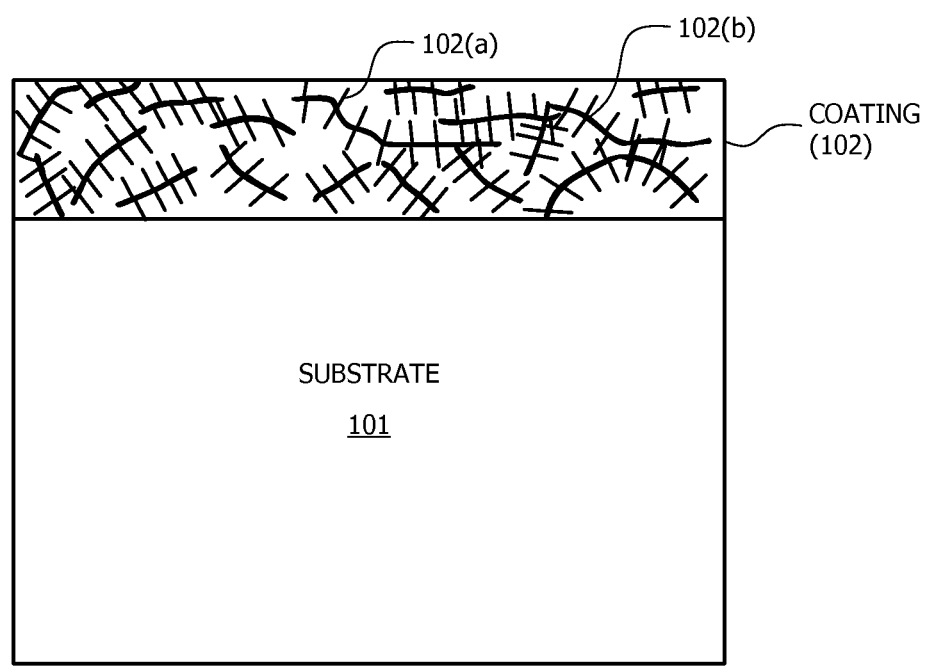
FIG. 1 is a cross sectional depiction of a coated substrate including a composite material comprising a plurality of supramolecular structures comprising a conjugated material non-covalently attached to a CNT or a graphene comprising structure, according to a disclosed embodiment.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

Disclosed embodiments include composite materials comprising at least one CNT or graphene comprising structure having an outer surface, and a plurality of at least partially crystalline supramolecular structures non-covalently secured to the outer surface of the CNT or graphene comprising structure. The supramolecular structures comprise at least in part a conjugated material, and the supramolecular structures extend outward from the outer surface of the CNT or graphene comprising structure.

The conjugated material can comprise a conjugated homopolymer, a block copolymer comprising at least one block of conjugated polymer and at least one block of a non-conjugated polymer, or a conjugated non-polymer material. The conjugated material can comprise a conjugated oligomer. An oligomer is defined herein as a molecule having 8 or less monomers.

The conjugated material can comprise a conjugated non-polymeric or non-oligomeric material. For example, the conjugated non-polymeric or non-oligomeric material comprises a polycyclic aromatic hydrocarbon (PAH). Example PAHs include pentacene, tetracene, hexacene, pyrene, and perylene.

The conjugated non-polymeric or non-oligomeric material can also comprise a heterocyclic macrocycle, such as one of the porphyrins such as porphine, or phthalocyanine which is structurally related to porphyrins. Porphyrins are aromatic heterocyclic macrocycles including four modified pyrrole subunits interconnected at their αcarbon atoms via methine bridges (=CH—), so that they obey Hückel's rule for aromaticity over the macrocycle.

As used herein, graphene comprising structures include pristine graphene, as well as graphene derivatives including, but not limited to, chemically derived graphene, graphite oxide (GO) and reduced GO (RGO). The graphene comprising structure can be in the form of monolayers or nanosheets. Nanosheets are aggregates comprising a few layers of graphene monolayers.

Disclosed embodiments also include methodologies that provide a versatile approach to functionalize CNTs and graphene comprising structures, and generate supramolecular structures that become non-covalently attached to CNT or graphene comprising structures. In some disclosed embodiments, modification of surface of the non-chemically modified or chemically modified CNTs or graphene is achieved by delivering existing functional groups to CNT or graphene surfaces, such as via the non-conjugated or conjugated block in a block copolymer having non-conjugated and conjugated blocks. In contrast, in conventional approaches, strong oxidants such as peroxides or strong acids such as nitric acid are used to break the carbon-carbon bonds on the CNT or graphene comprising surface and turn them into polar groups, such as COOH groups, thus chemically modifying (and thus degrading) the CNT or graphene surface.

An example method of forming composite materials includes dispersing a conjugated material, a solvent for the conjugated material, and a plurality CNT or graphene comprising structures to form a dispersion, wherein the CNT or graphene comprising structures includes an outer surface. The solvent is evaporated from the dispersion to form a CNT or graphene comprising conjugated composite material. The conjugated composite material comprises a plurality of at least partially crystalline supramolecular structures including at least a portion having the conjugated material non-covalently secured to the outer surface of the CNTs or graphene comprising structures. The supramolecular structures have an average length which extends outward in a length direction from the outer surface of the CNT or graphene comprising structures, wherein the average length is greater than an average width of the supramolecular structures.

The method can include heating the dispersion to at least 70° C., then cooling the dispersion at a cooling at a rate of <50° C./hour to room temperature before the evaporating. The cooling can induce crystallization. A mass ratio of the conjugated material to the CNT or graphene comprising structure is generally from 3 to 60.

Disclosed formation methods use a significantly higher conjugated polymer/CNT ratio as compared to known related work. In addition, disclosed embodiments recognize the crystallization process involves a cooling process, such as after a heating process and then cooling to room temperature. For example, Applicants' Example 1 described below discloses a conjugated polymer (P3HT)/CNT mass ratio of 300 µg/40 µg=7.5 without counting the P3HT in P3HT-b-PS, or If P3HT in P3HT-b-PS is counted the P3HT/CNT ratio is about 8, and the method also includes heating the mixture then cooling at a rate of 25° C./hour to room temperature.

As well known in the art of polymer chemistry, a copolymer (or heteropolymer) is a polymer derived from two (or more) monomeric species. Ordinary copolymers are formed using a single polymerization step that includes both monomers, which results in the generation of random copolymers. A special kind of copolymer is referred to herein as well as in the art as a "block copolymer". Block copolymers are made up of blocks of different polymerized monomers. For example, PS-b-PMMA is short for polystyrene-b-poly(methyl methacrylate) and is commonly fabricated by first polymerizing the monomer styrene, and then subsequently polymerizing the monomer MMA from the reactive end of the polystyrene chains. Such polymers formed from a 2-step polymerization is a "diblock copolymer" because it contains two different chemical blocks. By adjusting the process to add more polymerizations steps that alternate the monomer used, it is easy to see one can also make triblocks, tetrablocks, multiblocks, etc.

As defined and used herein, supramolecular structures (which can also be considered being assemblies) are well defined complexes of molecules held together by noncovalent bonds (e.g., $\pi$-$\pi$ bonds). Supramolecular structures denote larger complexes of molecules, typically hundreds or thousands that form a sphere, rod (e.g. nanoribbons or nanofibers) or sheet-like structures, having dimensions ranging in size from nanometers to micrometers. Thus, disclosed embodiments allow the fabrication of nanoscale objects/structures on CNT and graphene comprising structures using a bottom-up approach in far fewer steps than a single molecule of similar dimensions.

As noted above, in one embodiment the supramolecular structures comprise solely a conjugated polymer. In another embodiment, the polymer supramolecular structures comprise a block copolymer comprising at least one block of conjugated polymer and at least one block of a non-conjugated polymer. In other embodiments, the supramolecular structures comprise a conjugated non-polymer material. In a typical embodiment, the composition of matter includes a plurality of CNTs or a plurality of graphene comprising structures. In this embodiment, the supramolecular structures noncovalently and electrically couple at least a portion of respective CNTs or graphene comprising structures together.

In one embodiment, conjugated polymers or conjugated block copolymers can be utilized to disperse and functionalize either multiwall carbon nanotubes (MWCNTs) or single wall carbon nanotubes (SWCNTs), or mixtures thereof. Thus, in certain embodiments, the dispersing agent can be the block copolymer. As used herein, the block copolymer can be a diblock copolymer, triblock copolymer, multiblock copolymer or graft copolymer, where one or more conjugated blocks are grafts on a non-conjugated polymer block or one or more non-conjugated blocks are grafts on a conjugated polymer block.

A variety of solvents that are chemically inert towards the CNTs or graphene comprising structure, such that CNT or graphene bonding remains unaltered, can be used. Generally, but not necessarily, it is also desirable that the solvent is generally inert with respect to the conjugated polymer or other conjugated material. Generally, in the case of a block copolymer, the solvent is chosen by the solubility of the non-conjugated block of the block copolymer. Other factors that may be considered in the selection of the solvent depend upon the intended use of the CNT or graphene-conjugated-block-non-conjugated copolymer. Typically, the CNT or graphene dispersion can be prepared by a relatively gentle sonication of CNTs or graphene in the presence of a conjugated-block-non-conjugated copolymer solution.

In the case of a block copolymer, the non-conjugated polymer blocks can be common step-growth or chain-growth polymers that can be coupled with, grafted to, grafted on, initiate, or terminate a conjugated polymer to form the desired conjugated-block-non-conjugated polymer as long as the non-conjugated polymer is readily dissolved in one or more solvents or a mixture of solvents. The individual non-conjugated polymer block can be linear or branched. The polymers can generally range from stereoregular (tactic) or stereorandom (atactic). When possible the non-conjugated polymer can be regioregular (head to head or head to tail) or regiorandom. The non-conjugated branch can be a copolymer of two or more monomers. Among polymers that can be used for the practice of embodiments of the inventions include polystyrene, polyacrylates (such as polymethylacrylate), polymethacrylates (such as polymethylmethacrylate)polydienes (such as polybutadiene), polyalkyleneoxides (such as polyethyleneoxide), polyvinylethers, polyalkylenes, polyesters, polycarbonates, polyamides, polyurethanes, polyvinylpyrrolindone, polyvinylpyridine, polysiloxanes, polyacrylamide, epoxy polymers, and fluorinated variations of these polymers. The degree of polymerization of the non-conjugated block polymer can generally range from about 20 to about 1,000,000.

The conjugated block polymers can be, for example, polythiophene, polypyrrole, polydioxythiophene, polydioxypyrrole, polyfluorene, poly(thienyllene vinylene), polysilole, poly(dithensilole), poly(dibenzosilole), poly(dithienopyrrole), poly(thiazole), poly(thieno[3,2-6]thiophene), poly(thieno[3,2-6]thiophene vinylene), poly(benzothiadiazole), polycarbazole, polyfuran, polydioxyfuran, polyacetylene, poly(phenylene), poly(phenylene-vinylene), poly(arylene ethynylene), polyaniline, polypyridine, poly(3,3'''-didodecyl quarter thiophene), poly(2,5-bis(3-tetradecylthiophen-2yl) thieno[3,2-b]thiophene), poly(2,5-bis(3-tetradecylthiophen-2-yl)thiophen-2-yl)thiophen-2-ylthiazolo[5,4-d]thiazole) and any of these polymers that have substitutions such as alkyl, alkenyl, alkynyl, alkoxy, aryl, aryloxy, halogen, ester, or amide. The substituents can be chiral or achiral. The conjugated polymer itself can be a copolymer, for example having the same base conjugated repeating unit but different substituents on different repeating units or different conjugated repeating units. The conjugated polymers with substituents can be regio or stereo regular or regio or stereo random. The degree of polymerization of the conjugated block for the conjugated block polymer or conjugated polymer can generally range from 2 to about 1,000 depending upon the specific blocks ability to form sufficiently strong and stable interactions with the CNTs in the presence of the dispersing solvent. An exemplary conjugated polymer is P3HT.

Regarding certain parameters for disclosed composite materials, composite materials can be bulk porous materials with porosities ranging from 1%-99% or isolated structures such as a CNTs or graphene comprising structures having a plurality of polymer nanowires secured thereto. The density generally ranges from 4 mg/cm$^3$ to 900 mg/cm$^3$.

Regarding the bulk porous material, the porosity can be controlled by the concentration of CNT or the graphene comprising structure and the concentration of polymer. High concentrations lead to denser composite films and low concentrations will produce composite films with high porosity. The room temperature electrical conductivity is generally from 1 to 500 S/m. The porous material can find applications in energy conversion and storage, sensing and catalyzing, while the single (isolated) structures can be used in sensors and nanoelectronics.

FIG. 1 shows a cross sectional view of a coated substrate 100 comprising supramolecular structures on a CNT or graphene comprising structure, according to a disclosed embodiment. Coated substrate 100 comprises a substrate 101 and a composite coating 102 comprising a plurality of supramolecular structures 102(a) comprising a conjugated material non-covalently attached to a CNT or graphene comprising structure 102(b). Coated substrate 100 can be formed by casting a dispersion comprising the conjugated material, the CNT or graphene comprising structure, and a solvent on the surface of substrate 101, and then evaporating the solvent. The thickness of the composite coating 102 generally ranges from 0.1 µm to 200 µm.

The substrate 101 can comprise a variety of materials, including, but not limited to, metals, semiconductors and dielectrics (e.g. glasses), woods, fibrics, and plastics. Although not shown, the coating may be patterned, such as by using lithography techniques and ink jet techniques. The composite coating can generally contain 1 to 99 weight percent of CNTs or graphene comprising structures 102(b), and in the case the conjugated material is a conjugated block polymer, 1 to 99 weight percent conjugated polymer and 1 to 99.9 weight percent non-conjugated polymer. More typically, the CNTs or graphene comprising structures 102(b) comprise 25-75 wt. % of the composition and the polymer-based supramolecular structures 102(a) comprise 25-75 wt. % of the composition.

Disclosed embodiments provide a versatile approach to non-covalently functionalize CNTs and graphenes, and generate supramolecular structures on CNT and graphene surfaces. The resultant composite materials have applications in applications including, but not limited to, sensors, energy storage devices (fuel cells, batteries, and supercapacitors), photovoltaics, biomolecular imaging and detection, thermal management, and conductive nanocomposite. FIGS. 3A-D described below depict structures for some of these applications.

One disclosed embodiment is for an electronic device comprising a plurality of electrodes, wherein a disclosed composition of matter is between the electrodes. In another embodiment the electronic device comprises CNT or graphene comprising structures that can be used as electrodes connected by polymer or other conjugated material nanowires for nanoelectronic applications. For example, CNTs or graphene comprising structure can function as an electron acceptor (p type) and the conjugated material nanowires can function as an electron donor (n type) for applications to organic photovoltaic (OPV) devices.

Figure 3A:
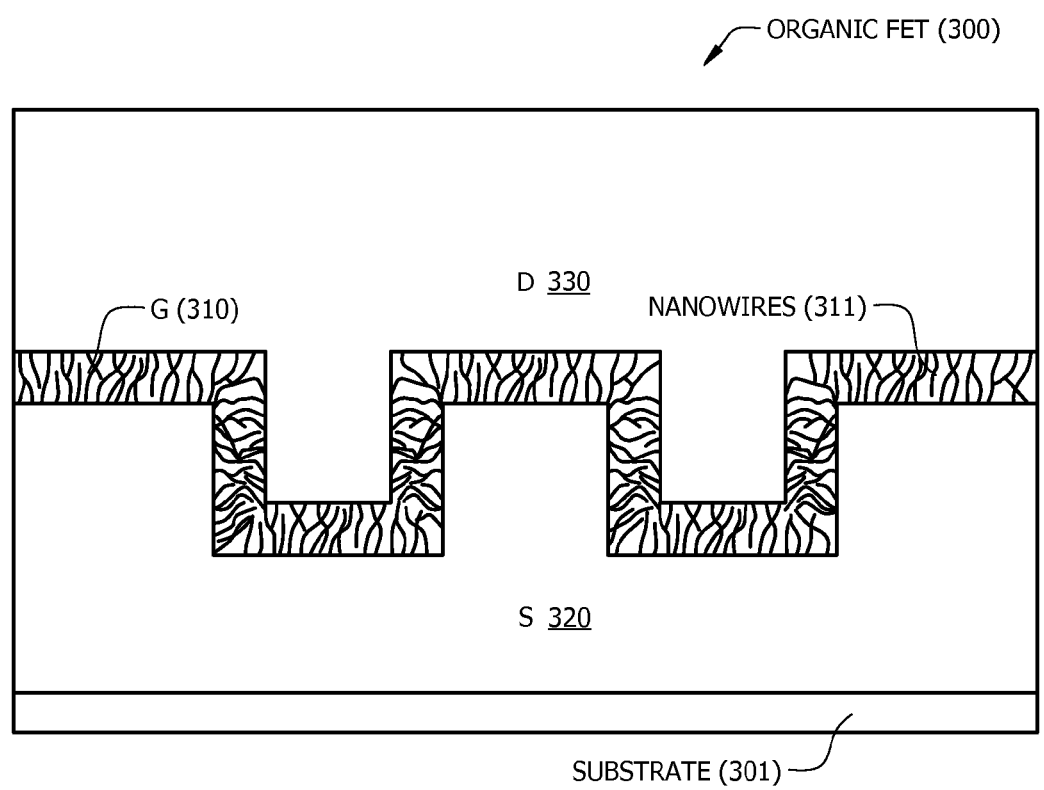
FIG. 3A is a simplified plan view depiction of an interdigitated organic field effect transistor (FET) comprising crystalline polymer supramolecular structures in the form of crystalline polymer nanowires that provide a gate/channel (G) region that connects interdigitated CNT array or a graphene comprising structure-based source (S) and drain (D) electrodes, according to a disclosed embodiment.

FIG. 3A is a simplified plan view depiction of an interdigitated organic FET 300 comprising crystalline polymer supramolecular structures in the form of a plurality of crystalline polymer nanowires 311 that provide a semiconductor/gate (G) region 310 that bridges/connects interdigitated CNT array or graphene comprising structure-based sources that provide both the (S) 320 and drain (D) 330 electrodes for organic FET. Organic FET 300 is built on a substrate 301. The S 320 and D 330 both can function as an electron acceptor (p type) while the crystalline polymer nanowires 311 comprising supramolecular structures can function as an electron donor (n-type) so that organic FET 300 can comprise a p-channel MOSFET.

The gate dielectric, gate electrode, gate contact, source contact, and drain contact are not shown in FIG. 3A for simplicity. As noted above, the crystalline polymer nanowires 311 comprise a conjugated polymer, such as a conjugated homopolymer (e.g., P3HT) or a block copolymer that includes at least one conjugated block. The crystalline polymer nanowires 311 are non-covalently secured to the outer surface of the CNTs or graphene comprising structures in S 320 and D 330. As known in the art, organic FET 300 can be used in sensing applications, as well as to form integrated circuits (ICs).

Figure 3B:
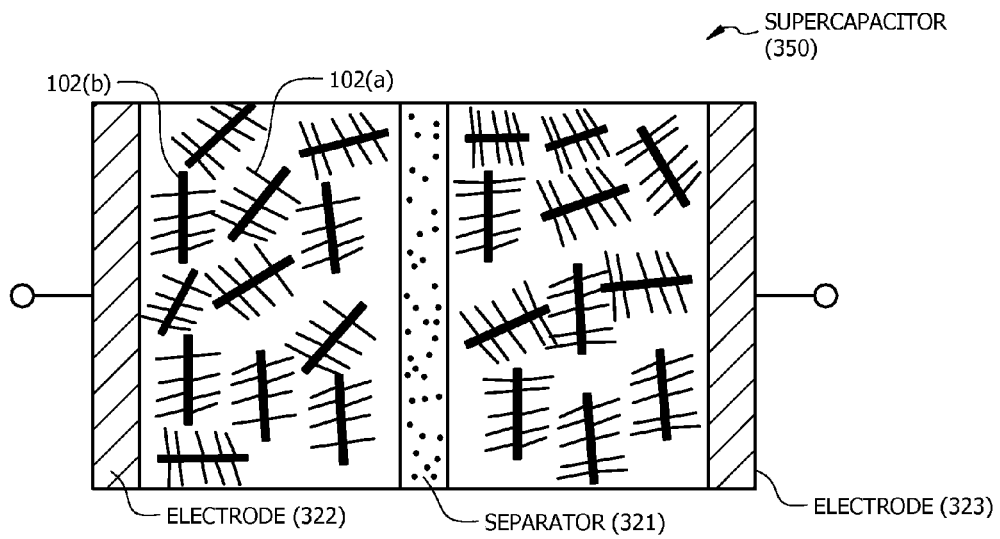
FIG. 3B is a depiction of a electric double-layer capacitor (supercapacitor) comprising disclosed supramolecular structures non-covalently attached to a CNT or a graphene comprising structure on both sides of a separator between a pair of electrodes, according to a disclosed embodiment.

FIG. 3B is a depiction of a electric double-layer capacitor (supercapacitor) 350 comprising a plurality of supramolecular structures 102(a) that comprise a conjugated polymer non-covalently attached to a CNT or graphene comprising structure 102(b). Supramolecular structures 102(a) attached to a CNT or graphene comprising structure 102(b) are on both sides of a separator 321 between a pair of electrodes 322 and 323. A single layer capacitor can be realized by excluding separator 321.

Figure 3C:
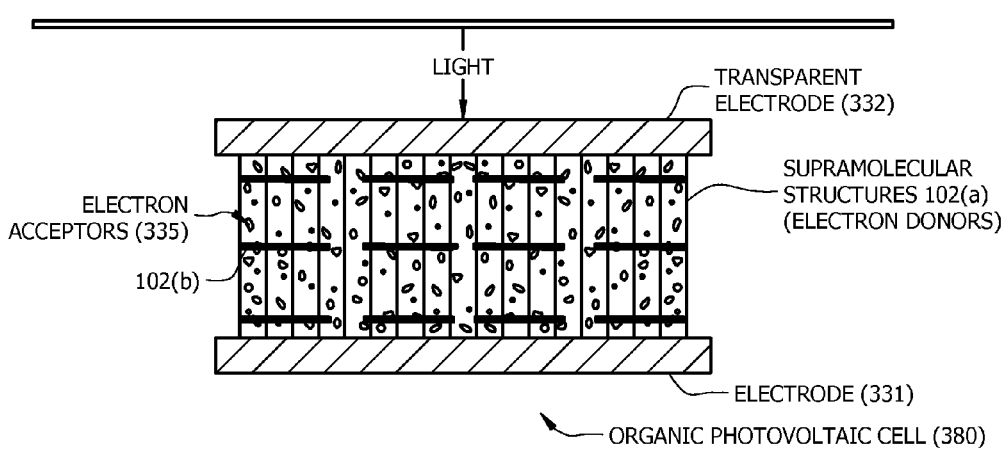
FIG. 3C is a depiction of an organic photovoltaic cell comprising disclosed supramolecular structures non-covalently attached to a CNT or a graphene comprising structure between a pair of electrodes, where one electrode is optically transparent, according to a disclosed embodiment.

FIG. 3C is a depiction of an organic photovoltaic cell 380 comprising disclosed supramolecular structures 102(a) non-covalently attached to a CNT or a graphene comprising structure 102(b) between a pair of electrodes 331 and 332, where one electrode 332 is optically transparent, according to a disclosed embodiment. One example optical transparent layer is indium tin oxide (ITO). Electron acceptors 335 are depicted between supramolecular structures 102(a).

Figure 3D:
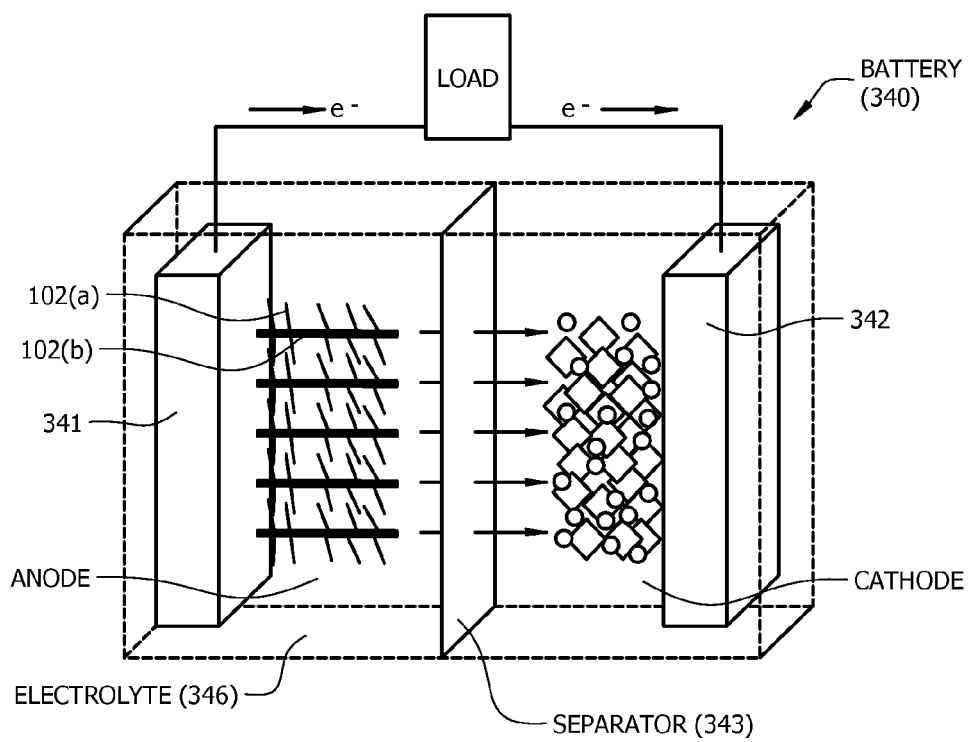
FIG. 3D is a depiction of a battery comprising disclosed supramolecular structures non-covalently attached to a CNT or a graphene comprising structure between a pair of electrodes, according to a disclosed embodiment, where the supramolecular structures in the battery function as the anode.

FIG. 3D is a depiction a battery 340 shown as a lithium ion battery comprising disclosed supramolecular structures between a pair of electrodes 341 and 342, one of side of the separator 343, according to a disclosed embodiment, where the supramolecular structures 102(a) are connected to electrode 341 and function as the anode for battery 340. The conductivity of the supramolecular structures 102(a) are expected to change upon the exposure to the electrolyte 346. The supramolecular structures can be cast into a thin film between the electrodes.

EXAMPLES

The following non-limiting Examples serve to illustrate selected embodiments. It will be appreciated that variations in proportions and alternatives in elements of the components shown will be apparent to those skilled in the art and are within the scope of embodiments disclosed herein.

Example 1

Figure 2A:
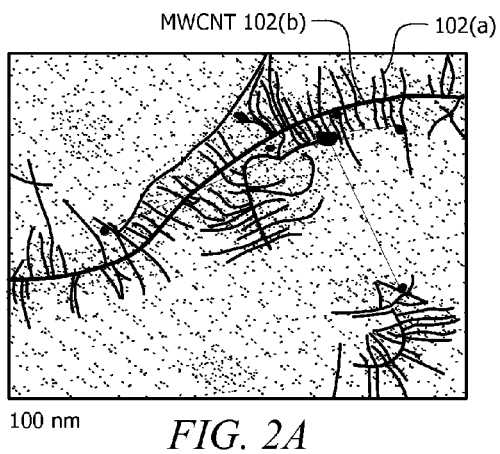
FIGS. 2A-D are depictions based on Transmission electron microscope (TEM) images of poly(3-hexylthiophene) supramolecular structures referred to herein as "P3HT" nanowhiskers on P3HT-polystyrene (PS) dispersed MWCNTs, P3HT-b-PVP nanowiskers on P3HT-b-PVP dispersed MWCNTs, P3HT nanowiskers on P3HT-b-PS dispersed SWCNTs, and P3HT nanowhiskers on graphene, respectively, according to some disclosed embodiments.
Figure 2B:
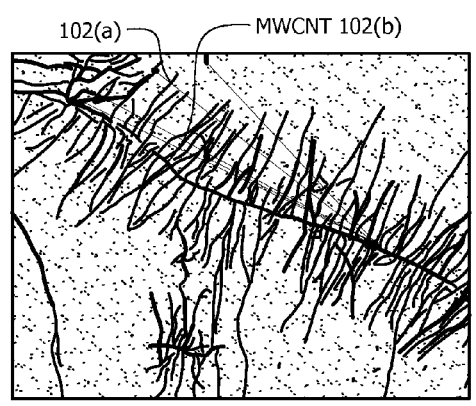
Figure 2C:
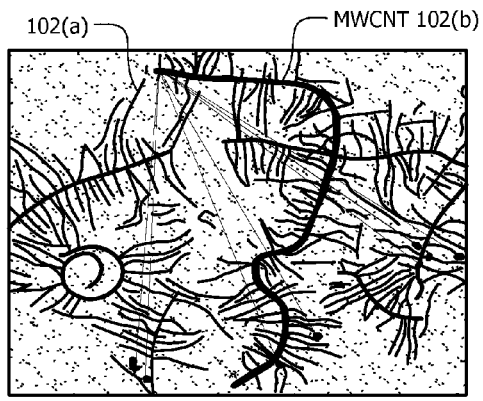
Figure 2D:
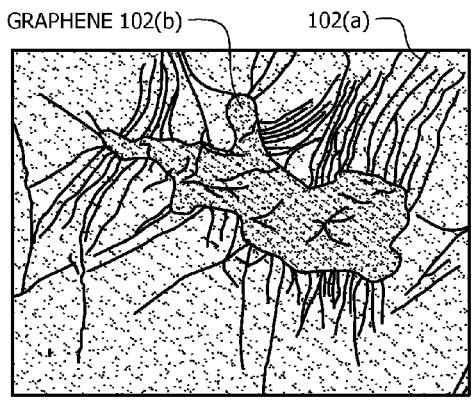

Supramolecular Polymer Structures on CNTs or Graphene 0.05 mL dispersed MWCNTs chloroform solution (0.8 mg/mL MWCNTs and 0.7 mg/mL P3HT-b-polystyrene (PS)) was added to 2.5 mL P3HT hot cyclopentanone solution (0.12 mg/mL, 80° C.). The mixture was cooled down to room temperature at 25° C./hour. The dispersions obtained were characterized by a transmission electron microscope (TEM) without further purification. As the solution slowly cooled down, P3HT started to form crystals due to the strong π-π interaction between the P3HT-b-PS on MWCNTs and P3HT, leading to a "centipede-like" structure shown in FIG. 2A. Using the same approach, a series of supramolecular structures were created using both MWCNTs and SWCNTs. For example, P3HT formed nanowhiskers on P3HT-b-PS dispersed SWCNTs as shown in FIG. 2B. P3HT-b-PVP formed nanowhiskers on P3HT-b-PVP dispersed MWCNTs as shown in FIG. 2C. These structures provide templates for constructing conducting polymer)/CNT multidimensional supramolecular structures. Moreover, P3HT and P3HT block copolymers can be used to disperse and functionalize graphene comprising structures, such as graphite, RG, and RGO. As shown in FIG. 1D, P3HT nanowhiskers are generated from the edges of a graphene monolayer.

Experimental Section

Chemicals and Materials.

Regioregular P3HT, regioregular P3HT-block-PS (P3HT-PS), and Regioregular P3HT-block-poly(N-vinylpyrrolidone) (P3HT-PVP) were synthesized via reported procedures. HiPco SWCNT was purchased from Carbon Nanotechnologies with (diameter: 0.8-1.2 nm; length: 100-1000 nm) with a purity above 65%. MWCNTs were purchased from Nanolab (diameter: 10-20 nm; length: 5-20 μm) with a purity above 95%. These as-received CNTs were used directly in the experiments without any further purification or chemical modification. Chloroform, cyclopentanone and cylcohexanone were purchase from Acros Organics and used as received.

Characterization

The chemical compositions of these polymers were examined by NMR using Varian Gemini-500 spectrometer at 500 MHz and $CDCl_3$ as solvent. The average molecular weight (Mn) and its polydispersity index (PDI) were determined by GPC using polystyrene as standard and THF as eluent. TEM images were obtained on JEOL 1011 electron microscope at 100 kV. High resolution transmission electron microscopic study (HRTEM) was conducted on a FEI Tecnai F30 TEM (FEI Company) at an acceleration voltage of 200 kV. Average length and width of nanofibrils were analyzed by ImageJ software. AFM images were acquired by using a Dimension 3100 Scanning Probe Microscope (Veeco Instruments Inc.) in standard tapping mode.

Preparation of CNT Dispersion

A typical dispersion procedure is provided below. 5.0 mg MWCNTs and 8.0 mg P3HT homopolymer were mixed in 10 mL chloroform and ultrasonically agitated for 2 h. After high-speed centrifugation (5000 rpm, 20 min), a small amount of black precipitate was removed. The remaining CNTs/P3HT dispersion was then treated as seeds to induce crystallization of P3HT in marginal solvents. A similar process was adopted to obtain the SWCNTs/P3HT dispersion while the feed ratio of SWCNTs to P3HT was 1:2.

P3HT Nanofibrils Growth from CNTs

A typical procedure is provided as follows. 1.0 mg P3HT was dissolved in 5.0 g heated cyclohexanone at 80° C. to form a transparent orange solution. 100 μL as prepared CNTs dispersion was then added. The mixture was cool down to room temperature at 25° C./h. After cooling, the obtained solution had an opaque brown color. TEM experiment confirmed the P3HT nanofibrils grew from the surface of CNTs.

P3HT Nanofibrils Growth from Graphenes

GO was prepared from natural graphite powder by the Hummer's method using concentrated $HNO_3$ $H_2SO_4$ and $KMNO_4$. The oxidation product was purified by rinsing with a 10% HCL solution, repeatedly washing with DI water. The slurry obtained was dried under vacuum. The dried product was dispersed in DMF using cap-horn sonication maintaining the concentration as 1 mg/ml. Then 5 ml of the GO dispersion was taken in a 20 ml glass vial and 5 ml of P3HT solution was added to it. Reduction was carried out by adding 1 ml of the hydrazine solution (0.1 ml hydrazine/5 ml of DMF) to the system and heated it at 90° C. for an hour under stirring. The solution turned black and precipitated. The precipitate was separated by centrifuging at 5000 rpm for 20 minutes. The precipitate was then dispersed in anisole at room temperature. 1 ml of the dispersion was mixed with 5 ml of the P3HT solution (0.1 mg/ml in anisole) sonicated for 30 minutes. The mixture was then heated at 80° C. for 10 minutes and immediately placed in a paper towel wrap for slow cooling of the system. Red precipitate was observed on complete cooling. The sample was directly drop casted on TEM grid and diluted 5 times with anisole to prepare sample for AFM.

Example 2

Supramolecular Structures on CNTs

Chemicals and Materials

Regioregular poly(3-hexylthiophene) (P3HT) was synthesized via a GRIM method. The degree of polymerization (about 45) and regioregularity (>96%) was estimated by end-group analysis using $^1H$ NMR. HiPco SWCNTs (diameter: 0.8-1.2 nm; length: 100-1000 nm) was purchased from Carbon Nanotechnologies with a purity above 65%. MWCNTs were purchased from Nanolab (diameter: 10-20 nm; length: 3-20 μm) with a purity above 95%. These as-received CNTs were used directly in the experiments without any further purification or chemical modification. Anisole was purchased from Acros Organics (New Jersey, USA) and used as received.

Characterization $^1$H-NMR spectra were recorded on Varian Gemini-500 spectrometer at 500 MHz using $CDCl_3$ as the solvent. The average molecular weight (MO and polydispersity index (PDI) were determined by GPC (JASCO LC2000) using polystyrene as standards and THF as an eluent. The $M_n$ of P3HT is 14800 with a PDI of 1.2, which is in agreement with that calculated from $^1$H-NMR spectra by taking into account of an overestimation factor of 2.0, when referenced to polystyrene standards. TEM images were obtained on JEOL 1011 electron microscope at 100 kV. Average length and width of nanofibrils were analyzed by ImageJ software. AFM images were acquired by using a Dimension 3100 Scanning Probe Microscope (Veeco Instruments Inc.) in standard tapping mode with Si cantilevers. UV-Vis absorption was measured using a Cary 300 UV-Visible spectrophotometer.

Preparation of CNTs Dispersions

MWCNTs (4.0 mg) and P3HT (4.0 mg) were mixed in 5 mL chloroform. The mixture was ultrasonically agitated for 2 hours in an ice-water bath, and centrifuged at a speed of 5000 rpm for 10 minutes. After the removal of a small amount of black precipitate, the remaining MWCNT/P3HT dispersion was then treated as seeds solution to induce crystallization of P3HT in anisole. A similar process was adopted to prepare the SWCNTs/P3HT dispersion. The mass ratio of SWCNT/P3HT was 1:1.7 and the concentration of SWCNT was 0.35 mg/mL.

P3HT Nanofibrils Preparation and In-Situ UV-Vis Measurement

P3HT (0.2 mg) was added to anisole (4.0 mL) in a 10 mL glass vial, and then heated to 70° C. to form an orange transparent solution with the P3HT concentration of 0.05 mg/mL. The solution was cooled to room temperature (around 25° C.) in few minutes. Since the solubility of P3HT in anisole at 25° C. is 0.013 mg/mL, P3HT precipitated from its supersaturated anisole solution to form nanofibriles. The solution was kept at room temperature 24 hours for crystallization. TEM images of obtained nanofibrils from the anisole solution evidenced an average width of 13 nm and length of 1-10 μm.

The crystallization process was monitored by in-situ Uv-Vis spectroscopy after the hot P3HT anisole solution was cooled down to room temperature by a water-bath. The UV-Vis absorption intensity at 600 nm was found to be very low. The absorption at 600 nm is assigned to the solid state P3HT absorption which presents the formation of P3HT crystals. Such low intensity suggests that trivial amount of P3HT crystallizes during the cooling process. The evolution of the Uv-Vis spectra also indicates that the crystallization process was very slow (up to 24 hours). The obtained nanofibril suspension is very stable. In contrast, higher concentration of P3HT (>0.1 mg/mL) will resulted in visible aggregates.

Fabricating P3HT Supramolecular Structures on Carbon Nanotubes

P3HT (0.2 mg) was dissolved in hot anisole (70° C., 4 mL) to form a transparent orange solution. A calculated amount of the as-prepared CNTs dispersion (determined by feed ratio) was then added. The mixture was cooled to room temperature in few minutes after the stirring was stopped. The solution was kept at room temperature 12 hours for crystallization. TEM images obtained confirmed the P3HT nanofibrils growing from the surface of CNTs. The TEM images also show that most of the P3HT form supramolecular structures on CNTs instead of in solutions. Additionally, P3HT supramolecular structures are more uniform on SWCNTs than those on MWCNTs.

Example 3

P3HT/CNT Supramolecular Structures

Hierarchical P3HT/CNT supramolecular structures were fabricated through a bottom-up CNT induced P3HT crystallization strategy. P3HT nanowires were found to grow perpendicular from CNT surface and have uniform width and height. The density and the length of these nanowires can be controlled by tuning the P3HT/CNT mass ratio. The quasi-isothermal crystallization process monitored by in situ UV-Vis spectroscopy indicates that CNTs can greatly enhance the P3HT crystallization, and the P3HT nanowire formation follows first-order kinetics. Such bottom-up strategy provides a general approach to build 2D functional conductive supramolecular structures that will lead to numerous applications in nanoscale electronics.

Preparation of CNT Dispersions:

MWCNTs (4.0 mg) and P3HT (4.0 mg) were added into 5.0 mL chloroform. The mixture was ultrasonically agitated for 2 h in an ice-water bath, and then centrifuged at a speed of 5000 rpm for 10 min. After the removal of a small amount of black precipitate, the remaining dispersion of MWCNTs was used to induce crystallization of P3HT in anisole. The concentration of MWCNTs in the dispersion was regarded as 0.80 mg·mL$^{-1}$ and mass ratio of P3HT/MWCNTs is 1:1. A similar process was adopted to prepare SWCNT dispersion. The concentration of SWCNTs in the dispersion was 0.35 mg·mL$^{-1}$ and the mass ratio of P3HT/SWCNTs was 1:1.7.

Fabrication of Poly(3-Hexylthiophene) (P3HT) Supramolecular Structures on CNTs:

(P3HT (0.2 mg) was dissolved into anisole (4.0 mL) by heating to 70° C. 42.0 mL as-prepared MWCNT dispersion was added (P3HT/MWCNTs mass ratio=7), and then the mixture was cooled to room temperature in few minutes. The solution was kept at room temperature for 12 h. To prepare P3HT/SWCNT supramolecular structures, 15.0 mL WCNT dispersion was added to 4.0 mL P3HT anisole hot solution, which gives the P3HT/SWCNT mass ratio of 40. The mixture was cooled to room temperature in few minutes and kept at room temperature for 12 h. The obtained deep purple dispersions were very stable for months at room temperature.

Results and Discussion

To fabricate P3HT supramolecular structures on CNT surfaces, P3HT dispersed pristine CNTs (SWCNTs or MWCNTs) were added to a hot P3HT anisole solution. The solution was then quickly cooled down to room temperature and kept overnight for crystallization. Due to the low solubility of P3HT in anisole at room temperature, P3HT molecules precipitated from the supersaturated solution, and formed supramolecular structures (nanowires) on CNT surfaces. The resulting dark purple suspension was stable at room temperature for months, and the obtained supramolecular structures were examined by transmission electron microscopy (TEM) and atomic force microscopy (AFM).

The TEM images obtained show that ordered P3HT nanowires grow perpendicularly from both MWCNT and SWCNT surfaces, generating 2D supramolecular structures. The width of the nanowires is the same as that of the free P3HT nanowires prepared without CNTs. It is noted that, although excess P3HT molecules were present in the solution, almost all of the P3HT molecules formed nanowires on CNTs with a negligible amount of free nanowires in the solution. This observation suggests that such bottom-up process generates clean P3HT supramolecular structures on CNTs. Most interestingly, the connection of two SWCNTs by P3HT nanowires with parallel orientation was observed.

In contrast to previous studies, where P3HT nanowires were placed on metal electrodes manually, P3HT nanowires were found by the Inventors to connect CNTs through a bottom-up assembling from CNT surfaces. Such a process leads to good nanowire/CNT contacts due to pi-pi interaction between P3HT nanowires and SWCNTs. This result indicates that CNTs can be connected with each other by P3HT nanowires when CNTs are aligned in an appropriate distance, demonstrating the potential of building ordered conductive networks. Moreover, other image obtained clearly show that the obtained supramolecular structures on MWCNTs are affected by the CNT diameter and surface curvature. Generally, MWCNTs with large diameter and less surface curvature have a higher density of nanowires. In contrast, the nanowires on SWCNTs are more uniform because SWCNTs are straight with similar diameters. Therefore, SWCNTs were employed to investigate the influence of P3HT/CNT mass ratio on the morphology of P3HT supramolecular structures by preparing a series of samples with different P3HT/SWCNT mass ratio.

With the reducing of the P3HT/SWCNT mass ratio from 40 to 5, the average length of P3HT nanowires was found to decrease approximately from 400 to 40 nm. The density of the nanowires on CNTs also decreases with the decremented P3HT/SWCNT mass ratio. These results show that the length and density of P3HT nanowires can be controlled by tuning the P3HT/CNT mass ratio.

AFM height images obtained show the same P3HT supramolecular structures on CNT surfaces as those observed by TEM. From the AFM cross-section analysis, the height of the P3HT nanowires is around 3-5 nm on both MWCNTs and SWCNTs, which is approximately two or three times of the lattice dimension of the P3HT unit cell (1.68 nm). The height of MWCNTs and SWCNTs was about 17 and 1 nm, respectively. The width of the P3HT nanowires is around 28-32 nm determined by AFM. The deviation from the values given by the TEM (12-15 nm) may be caused by the AFM tips.

The formation of the 2D P3HT supramolecular structures is assumed to be triggered by the CNT enhanced crystallization of P3HT, where the dispersed CNTs function as the nucleation seeds to grow P3HT nanowires. Such process can be considered quasi-isothermal since the quenching of the hot solution to room temperature takes much less time (one minute) than the completion of the nanowire formation (more than three hours). The P3HT (0.05 mg·mL$^{-1}$) isothermal crystallization processes in anisole with and without CNTs were studied by in situ UV-Vis spectroscopy. The evolution of UV-Vis absorption of P3HT in anisole with MWCNTs during the crystallization process was examined. The intensity of the absorption at 455 nm attributed to individual or isolated P3HT chain in solution decreases, while the low-energy absorption bands at 510, 550, and 600 nm was found to increase. These low-energy peaks were explained as a combination of a π-π electronic transition and a strong lattice vibration in P3HT crystalline domains. The presence of an obvious isosbestic point at 481 nm in the UV-Vis spectra suggests a direct transformation from dissolved individual polymer chains to ordered nanowires without any intermediate state. The absorbance in these fine structural peaks can be employed as a quantitative method to evaluate the amount of the crystallized P3HT in the dispersion. It was found that MWCNTs can greatly accelerate the crystallization of P3HT. The crystallization of P3HT was completed in less than 3 hr with the presence of MWCNTs, while it takes more than 24 h for free P3HT to finish the crystallization.

Moreover, the quasi-isothermal P3HT nanowire growth processes follow the first-order kinetics, which can be simply explained by a classic crystallization theory. In the isothermal growth kinetics of polymer single crystals in dilute solutions, the concentration dependence of the growth rate has generally been expressed by an empirical relation as Equation (1). Where G is the growth rate measured from <110> growth face to the center of the single polymer crystal, C the concentration of the solution, and a is the concentration exponent which depends on the concentration and the molecular weight of the polymer.

$$G \text{ proportional to } C^\alpha \qquad \text{Equation 1:}$$

For 1D P3HT nanowire growth (<010> face), the growth rate G can be expressed as Equation 2. Where W is the concentration of crystallized P3HT and C is the concentration of dissolved P3HT.

$$G = dW/dt = -dC/dt \text{ proportional to } C^\alpha \qquad \text{Equation 2:}$$

Therefore, the order of growth kinetics is determined by concentration exponent a. When the in situ UV-Vis spectroscopy is used to monitor the P3HT crystallization process, the absorbance change at 600 nm corresponds to the formation of P3HT nanowires. Such absorbance change follows Equation (2) with α=1, indicating a first-order growth kinetics.

Conclusion

This Example demonstrates a bottom-up approach to fabricate 2D P3HT supramolecular structures on CNTs. The quasi-isothermal crystallization process monitored by in situ UV-Vis spectroscopy indicated the first-order kinetics of P3HT nanowire formation. P3HT nanowires growing from CNT surfaces can connect aligned CNTs with good contact. Additionally, other experiments by the Inventors indicates that P3HT supramolecular structures can also be fabricated on the surfaces of other nanoscale objects such as nanoelectrodes and graphenes. It is believed to be a general approach to build functional supramolecular structures that will lead to numerous applications in nanoscale electronics.

Example 4

P3Ht Supramolecular Structures on RGO

P3HT supramolecular structures were fabricated on P3HT-dispersed (RGO monolayers and surfactant-free RGO monolayers. P3HT was found to be able to disperse RGO in hot anisole/N,N-dimethylformamide solvents, and form nanowires on RGO surfaces through a RGO induced crystallization process. A TEM and AFM investigation of the resultant P3HT/RGO composites shows that P3HT nanowires grow from RGO, and provide an electrical connection between individual RGO monolayers. Raman spectroscopy confirmed the interaction between P3HT and RGO, which allows the manipulation of the RGO electrical properties. Such a bottom-up approach provides graphene-based composites for applications including nanometer-scale electronics.

Materials:

Regioregular P3HT was synthesized by a Grignard metathesis (GRIM) method. The degree of polymerization and regioregularity (>96%) of the P3HT was estimated by end-group analysis using 1H NMR spectroscopy. Graphite flakes were purchased from Dixon(Microfyne). Anisole and N,N-dimethylformamide (DMF) were purchased from Acrosorganics (New Jersey, USA) and used as received. Hydrazine hydrate was purchased from Sigma-Aldrich (St. Louis, Mo.).

Characterization

GO was prepared from natural purified graphite by Hummer's method Samples for atomic force microscopy (AFM) imaging were prepared by depositing samples on freshly cleaved mica substrates (Ted Pella Inc., Redding Calif.). AFM images were taken on a Dimension 3100 Scanning Probe Microscope (Veeco Instruments Inc). Images were obtained using tapping mode with a Si cantilever. All images were collected under ambient conditions at 60% relative humidity and at 25° C. with a scanning rate of 0.5 Hz.

Transmission electron microscopy (TEM) images were obtained on a JEOL 1011 electron microscope at 100 kV. UV-vis absorption was measured using a Cary 300 UV-visible spectrophotometer. Raman spectroscopy was performed using a Renishaw InVia Raman microscope comprised of a laser (532 nm line of solid Si laser), a single spectrograph fitted with holographic notch filters, and an optical microscope (a Leica microscope with a motorized XYZ stage) rigidly mounted and optically coupled to the spectrograph. The spectrometer was calibrated with a Si standard using a Si band position at 520.3 cm$^{-1}$. The electrical conductivity of RGO/P3HT and RGO thin films was measured using a four-probe method and a Keithley 2400 instrument.

GO Dispersion

In a typical method, GO (1.5 mg) was mixed with 15 mL of DMF in a vial and subjected to 6 h continuous ultrasonication in a cold water bath. The sonication was performed using a Cup Horn Ultrasonic Convertor, to yield a clear homogeneous yellow brown dispersion. The GO dispersion (0.1 mg·mL$^{-1}$ in DMF) was deposited on mica for AFM imaging.

P3HT Synthesis and In-Situ UV-Vis Spectroscopic Studies of the Crystallization Process:

P3HT was synthesized using the Grignard metathesis (GRIM) method. 1H NMR spectra were recorded on a Varian Gemini-500 spectrometer at 500 MHz using CDCl3 as the solvent.

The average molecular weight (Mn) and polydispersity index (PDI) were determined by gel permeation chromatography (GPC, JASCO LC2000) with a diode-array UV-Vis detector, and a refractive-index detector, using polystyrene as standards and tetrahydrofuran (THF) as an eluent. The average molecular weight of P3HT was found to be 14,800 with a PDI of 1.2, which is in agreement with that calculated from 1HNMR spectra by taking into account an overestimation factor of 2.0, when referenced to polystyrene standards. P3HT (1 mg) was added to anisole (10 mL) in a glass vial and heated to 80° C. to form an orange transparent solution (0.1 mg·mL$^{-1}$). The solution was cooled to room temperature (25° C.). The solution was kept at room temperature overnight for crystallization whereupon it turned purple, which indicated nanowire formation in the solution. The crystallization process was monitored by in-situ UV-Vis spectroscopy after the hot P3HT anisole solution was cooled to room temperature by a water bath.

Regarding UV-Vis absorption spectra of P3HT homopolymers during the crystallization process, the absorption band at 600 nm is assigned to the solid state P3HT, which presents the formation of nanowires. The crystallization process starts with very low absorption intensity at 600 nm. Such a low intensity suggests that a trivial amount of P3HT crystallizes during the quenching process. This observation allows the study of P3HT crystallization kinetics under isothermal conditions. The evolution of the UV-Vis spectra also indicates that the crystallization rate is very slow (up to 24 h).

Dispersing RGO Using P3HT and Fabricating P3HT Supramolecular Structures on RGO Nano sheets A hot P3HT solution in anisole (1.8 mL, 0.1 mg·mL$^{-1}$) was mixed with 200 mL of a GO dispersion in DMF (0.1 mg·mL$^{-1}$). A hydrazine solution (35 mL, 35% in DMF) was added to the mixture. The mixture was heated at 95-100° C. for 1 h and cooled to room temperature. After 10 h, the resultant purple suspension in the mixture was separated by centrifugation. The precipitate was redispersed in 1 mL of hot anisole and yielded a clear yellow solution. One milliliter of the solution was mixed with 5 mL of a hot P3HT solution in anisole (0.1 m mg·mL$^{-1}$). The solution was heated at 70° C. for 10 min and cooled slowly overnight to form P3HT nanowires on the surface of the RGO nanosheets.

Results and Discussion

GO is hydrophilic and readily dispersed in water and DMF as monolayers, because of the large amount of hydroxy, carboxy, carbonyl, and epoxide functional groups on its surface generated by oxidation. However, because of the removal of the surface functional groups, the reduction of GO results in RGO agglomeration and precipitation in DMF. Based on previous inventor' research on dispersing CNTs using P3HT, it was anticipated that P3HT would interact with isolated graphitic domains on RGO and improve the dispersibility. To test the hypothesis, a GO monolayer dispersion in DMF was mixed with a hot P3HT anisole solution followed by the addition of a hydrazine DMF solution to reduce the GO. In comparison, hydrazine was also added to a GO monolayer dispersion in DMF/anisole without P3HT. In both cases, the DMF/anisole mixture dissolved both the GO and P3HT, and the solution temperature was kept at 90° C. As was expected, the RGO in DMF/anisole was found to be well dispersed by P3HT while the RGO forms precipitates without P3HT.

The hot RGO/P3HT suspension was spin deposited on a mica substrate and examined by AFM. The AFM image evidenced that most RGO/P3HT composites exist as monolayers with an average thickness of about 1.3 nm. The thickness of the RGO/P3HT monolayer is about 0.4 nm more than that of the surfactant free RGO monolayer (0.9 nm), which suggests the deposition of a thin layer of P3HT on the RGO surfaces. It is interesting to note that, at a concentration of 0.1 mg·mL$^{-1}$ in solution, no P3HT nanowires are observed in the AFM image. While in previous studies by the Inventors, P3HT can form nanowires at a concentration of 0.05 mg·mL$^{-1}$ in anisole. Such observations result from the spin deposition of the hot RGO/P3HT suspension, where most free P3HT in the solution is removed before forming nanowires. It is not surprising to find that GO/P3HT forms a purple suspension when the solution is cooled with the formation of P3HT nanowires. TEM images of the suspension evidenced the presence of short P3HT nanowires on RGO surfaces.

To fabricate longer P3HT nanowires on RGO surfaces in solution, P3HT-dispersed RGO was added to a hot P3HT anisole solution. The solution was then quickly cooled to room temperature and kept overnight for P3HT crystallization. Because of the low solubility of P3HT in anisole at room temperature, P3HT molecules precipitated from the supersaturated solution, and formed supramolecular structures (nanowires) on the RGO surfaces. The obtained supramolecular structures were examined by TEM and AFM.

The TEM obtained evidenced that P3HT nanowires grow from the RGO surfaces, to generate 2D supramolecular structures. The width of the nanowires is about 14 nm, which is the same as that of the free P3HT nanowires prepared without RGO. The selected area electron diffraction (SAED) pattern of the P3HT nanowires clearly evidenced (010) phase reflection, which suggests the presence of P3HT crystalline structures. It is important to note that, although excess P3HT molecules are present in the solution, most of the P3HT molecules formed nanowires on RGO with some free nanowires remaining in the solution. This observation suggests that RGO may function as seeds for the formation of P3HT supramolecular structures.

The AFM height image obtained evidenced the same P3HT supramolecular structures on RGO surfaces as those observed by TEM. The individual RGO monolayers are clearly visible from the height contrast. From the AFM height analysis, the height of the RGO is found to be around 1.3 nm and the height of P3HT ranges from 4 to 5 nm, which is approximately 2 or 3 times the lattice dimension of the P3HT unit cell (1.68 nm). It is interesting to note that P3HT nanowires connect individual RGO nanosheets, which allows applications in nanometer-scale graphene-based electronics.

The P3HT supramolecular structures were also fabricated on surfactant-free RGO monolayers on mica substrates. The RGO monolayer was produced by a hydrazine reduction of GO dispersed in basic aqueous solutions. In the studies performed, a drop of hot P3HT anisole solution (0.1 mg·mL$^{-1}$) was placed on the mica substrate covered with RGO monolayers. After 20 s, excess solution was spun off the substrate, and the sample was examined by AFM. An AFM height image was obtained. The height analysis of the sample suggests that the thickness of RGO is about 1.3 nm while the height of the P3HT nanowires is about 1.7 nm. Compared with the height of the P3HT nanowires (4-5 nm) described above, the P3HT nanowires formed through this process are a monolayer P3HT unit cells. The inventors believe that such a result is attributable to the fast spin-removal of P3HT solutions that hinders the self-assembly of multiple P3HT unit cells.

The formation of the 2D P3HT supramolecular structures is triggered by the RGO-enhanced crystallization of P3HT, where the dispersed RGO monolayers function as the nucleation (0.05 mg·mL$^{-1}$) isothermal crystallization processes in anisole with GO and RGO were studied by in-situ UV-Vis spectroscopy (see Supporting Information). The crystallization process was investigated by plotting the change of the UV-Vis absorbance at 600 nm versus time. The in-situ UV-Vis spectroscopy studies suggest that RGO can greatly accelerate the crystallization of P3HT. The interaction between P3HT and GO was investigated by examining GO, RGO, P3HT nanowires, and P3HT nanowires on RGO using Raman spectroscopy.

Raman spectroscopy is a widely used tool to study the structure of conjugated carbon bonds because of their high Raman intensities. In contrast to the Raman spectrum of highly ordered graphite, which shows a sharp Raman band of the graphite lattice at 1,580 cm$^{-1}$ (G band) and a weak disorder band caused by the graphite edges (D band), a strong D band appears at 1,355 cm$^{-1}$ in the Raman spectrum of GO, which is attributed to the sp3 amorphous carbons generated by the oxidation. In addition, the G band becomes broader and blue shifts to 1,599 cm$^{-1}$, which is in good agreement with reported data. The Raman spectrum of the RGO showed two peaks at 1,604 cm$^{-1}$ (in plane vibrational G band), and 1,345 cm$^{-1}$ (disordered vibrational D band). The G band of RGO shifts to a higher frequency in comparison with pristine graphite, which is attributed to the less ordered carbon and defects of the RGO sheets. In the Raman spectrum of the P3HT nanowires, two dominant peaks observed at 1,378 and 1,443 cm$^{-1}$ are assigned to C—C skeletal stretching and C=C ring stretching, respectively. It is expected that the interaction between the RGO and electron-donating P3HT will lead to a shift of G and D band frequencies.

Su and co-workers reported that the G band of the RGO in the Raman spectra was low frequency shifted by electron donors and high frequency shifted by electron acceptors. The G band of the RGO/P3HT nanowires composite was shifted by 15 cm$^{-1}$ from 1604 (RGO) to 1589 cm$^{-1}$, which suggests the interaction between RGO and P3HT. The peak at 1447 cm$^{-1}$ signifies that P3HT nanowires remain unaltered and the new peak at 1359 cm$^{-1}$ is a result of the shifting and overlapping of the D band of P3HT and RGO. Therefore, the Raman shift of the G band suggests the interaction between P3HT nanowires and RGO sheets. The electrical conductivity of the films deposited from the suspension of surfactant-free RGO, P3HT-dispersed RGO, and a P3HT solution was measured using a four-probe method. The conductivity of the P3HT-dispersed RGO films is 6.0×10$^{-3}$ S·m$^{-1}$ while the conductivity of RGO and P3HT films is 103 S·m$^{-1}$ and 1.2×10$^{-4}$ S·m$^{-1}$, respectively. The lower conductivity of the P3HT-dispersed RGO film compared to that of the RGO film is attributed to the separation of RGO layers by semiconductive P3HT, which is less conductive than RGO. The RGO in the P3HT-dispersed RGO films leads to a higher electrical conductivity than pure P3HT films.

Conclusion

In summary, in this example a bottom-up approach to fabricate 2D P3HT supramolecular structures on dispersed RGO monolayers is described. The quasi-isothermal crystallization process monitored by in-situ UV-vis spectroscopy indicates RGO-induced P3HT nanowire formation. Raman studies suggest the interaction between P3HT nanowires and RGO, which provides an approach to manipulate the electrical properties of RGO. This general approach to build functional supramolecular structures will lead to numerous applications in nanometer-scale electronics.

Example 5

Fabrication of Organic FETs by Directly Grown P3HT Nanowires on a CNT Aligned Array Electrode SWNT electrodes were fabricated. At first, palladium (Pd) patterns were fabricated by electron beam lithography (EBL) followed by thermal evaporation of 30 nm Pd and standard lift-off. Highly purified, stable and surfactant free SWNT aqueous solution was obtained and was diluted by six times in DI water. A 3 μL drop of the solution was placed on the Pd patterns and an ac voltage of 5 Vp-p at 300 kHz was applied between the Pd patterns for 30 seconds. The ac voltage creates a time averaged dielectrophoretic force between Pd electrode patterns and aligns the SWNTs. After SWNT alignment, PMMA was spin coated on the samples at 4000 rpm for 60 seconds followed by baking at 180° C. for 15 minutes on a hotplate. A precise window of interdigitated electrode pattern was opened by EBL writing and developing in a mixture of MIBK and IPA. The EBL was done by Zeiss Ultra-55 SEM combined with Nabity pattern generator. To etch the exposed SWNT array through the open window, the samples were put in the oxygen plasma cleaner and were etched for 10 minutes. Finally, devices were kept into the chloroform for 12 hours and rinse with acetone, IPA, ethanol and DI water to remove the remaining PMMA.

For control for the experiment, gold interdigitated electrodes were also fabricated with the same geometry as the SWNT electrodes by EBL and thermal deposition of gold and standard lift off. All of the OFET devices in this experiment had channel length (L) of 1 μm and total channel width (W) of 40 μm.

P3HT nanowires were then grown on the SWNT electrodes. P3HT and anisole were used as received. In this experiment, no additional surface treatment such as octadecyltrichlorosilane (OTS) or hexamethyldisilazane (HMDS) was performed on SiO$_2$ surface. P3HT powder was dissolved in anisole with a concentration of 0.25 mg/mL at 90° C. in a glass vial. One chip of SWNT electrode was then immersed inside the P3HT solution, which was cooled down to room temperature at a rate ~20° C./hour and kept 12 hours for P3HT crystallization.

The devices were characterized. Tapping mode atomic force microscopy (AFM) images were acquired by Dimension 3100 AFM (Veeco). The scanning electron microscopy (SEM) images were taken using Zeiss Ultra-55 SEM with an accelerating voltage 1 kV. Raman spectroscopy was performed using a Renishaw InVia Raman microscope comprised of a laser (532 nm line of solid Si laser), a single spectrograph fitted with holographic notch filters, and an optical microscope (a Leica microscope with a motorized XYZ stage) rigidly mounted and optically coupled to the spectrograph. The spectrometer was calibrated with a Si standard using a Si band position at 520.3 cm$^{-1}$. The electrical transport measurements of SWNT array were carried out by DL instruments 1211 current preamplifier and a Keithley 2400 source meter interfaced with LabView program. The OFET characteristics were measured using a Hewlett-Packard (HP) 4145B semiconductor parametric analyzer connected to a probe station inside an enclosed glove box system filled with nitrogen gas.

AFM images obtained clearly showed that the P3HT nanowires connected the SWNT source and drain interdigitated CNT electrodes. Selected area electron diffraction (SAED) patterns of the nanowires show the (020) reflection (d=0.38±0.01 nm), confirming that the polymer chains were well-stacked perpendicularly to the nanowire long axis (direction of π-π interaction). In addition, Raman spectra of SWNTs and SWNTs with P3HT nanowires indicated the molecular level interaction between SWNT and P3HT, suggesting good contact between two materials. Gold interdigitated electrodes with the same architecture as SWNT electrodes were also immersed into the P3HT hot anisole solutions to check the growth of P3HT nanowires on the gold electrodes. Since there is no interaction between gold electrodes and P3HT, it was not surprising for the Inventors to find that P3HT form nanowires in the cooled solution and deposit randomly on the gold electrodes. The gold electrode OFET with similar P3HT coverage density as the SWNT electrode OFET was fabricated for comparison of device characteristics. A total of 14 OFET devices with SWNT electrodes and 10 OFET devices with gold electrodes were tested.

Comparing disclosed OFETs with conventional FETs having metal electrodes instead on CNT electrodes, the disclosed devices with SWNT S and D electrodes showed consistently higher mobility and higher current on-off ratio with a maximum of 0.13 cm$^2$/Vs and 3.1×10$^5$, respectively. The improved device characteristics were also demonstrated by the absence of short channel effect which was dominant for the conventional gold electrode OFETs. Such remarkable improvement of the device performance as high mobility, high current on-off ratio, absence of short channel effect and better charge carrier injection may be attributed to the improved contact via strong π-π interaction SWNT electrodes with the crystalline P3HT nanowires as well as the improved morphology of P3HT due to a crystalline structure. These results are expected to have significant impact on the development of high performance organic electronic devices, including organic FETs and devices therefrom including sensors and ICs.

Example 6

Supramolecular Structures on RGO Having a Conjugated Non-Polymeric or Non-Oligomeric Material Comprising Phthalocyanine As noted above, the conjugated material can comprise a conjugated non-polymeric or non-oligomeric material, such as a polycyclic aromatic hydrocarbon (PAH) or a heterocyclic macrocycle. In this example, the heterocyclic macrocycle used is phthalocyanine. RGO composites containing tetrasulfonate salt of copper phthalocyanine (TSCuPc) were fabricated through the reduction of GO in the presence of water-soluble TSCuPc.

The interaction between the RGO monolayer and TSCuPc was investigated using ultraviolet-visible (UV-vis) spectroscopy, X-ray photoelectron spectroscopy, and Raman spectroscopy. The composites of electron donor (TSCuPc) and acceptor (RGO) were successfully incorporated in devices, and their optoelectronic properties studied. Compared with RGO films, the RGO/TSCuPc composite films were found to have lower conductivity (dark current) but much higher photoconductivity and photoresponsivity because of the presence of donor/acceptor materials and large donor/acceptor (D/A) interfaces for charge generation. The optoelectrical properties of the composite film was found to be improved by thermal annealing and optimizing the TSCuPc content.

Samples for AFM were prepared by spin-coating a composite suspension on a freshly cleaved mica substrate. A cross-section analysis in the AFM height image indicated the thickness of the TSCuPc attached RGO sheet to be ~1.9 nm, whereas the thickness of a single layer RGO was found to be ~1 nm other's studies. Therefore, the AFM height image data obtained provided evidence of the noncovalent attachment of the aromatic heterocyclic macrocycle molecules (TSCuPc) on the RGO basal plane through π-π interaction.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The invention claimed is:

1. A method of forming composite materials, comprising:
   dispersing a conjugated material, a solvent for said conjugated material, and a plurality of carbon nanotubes (CNTs) or graphene comprising structures to form a dispersion, wherein said CNTs or said graphene comprising structures includes an outer surface, and
   evaporating said solvent from said dispersion to form a CNT or graphene comprising conjugated composite material,
   wherein said conjugated composite material comprises a plurality of at least partially crystalline supramolecular structures including at least a portion having said conjugated material non-covalently secured to said outer surface of said CNTs or said graphene comprising structures, and
   wherein said supramolecular structures have an average length which extends outward in a length direction from said outer surface of said CNTs or said graphene comprising structures, wherein said average length is greater than an average width of said supramolecular structures.

2. The method of claim 1, further comprising casting said dispersion on a substrate before said evaporating.

3. The method of claim 1, wherein said conjugated material comprises a conjugated homopolymer or a block copolymer comprising at least one block of a conjugated polymer and at least one block of a non-conjugated polymer.

4. The method of claim 3:
   wherein said conjugated polymer comprises poly(3-hexylthiophene) (P3HT) and said graphene comprising structure comprises reduced graphene oxide (RGO) monolayers, and
   wherein following said evaporating, said P3HT forms nanowires that grow from said RGO monolayers, and connect respective ones of said RGO monolayers.

5. The method of claim 1, wherein said conjugated material comprises a conjugated oligomer.

6. The method of claim 1, wherein said conjugated material comprises a conjugated non-polymeric or non-oligomeric material.

7. The method of claim 6, wherein said conjugated non-polymeric or non-oligomeric material comprises a polycyclic aromatic hydrocarbon (PAH).

8. The method of claim 6, wherein said conjugated non-polymeric or non-oligomeric material comprises a heterocyclic macrocycle.

9. The method of claim 1, wherein said supramolecular structures comprise nanocolumns, nanoribbons or nanofibers.

10. The method of claim 1, wherein said supramolecular structures non-covalently couple and electrically couple at least a portion of respective ones of said CNTs or said graphene comprising structures together.

11. The method of claim 1, wherein said graphene comprising structure comprises pristine graphene, chemically derived graphene, reduced graphene oxide (RGO) or graphene oxide (GO).

12. The method of claim 11, wherein said graphene, said chemically derived graphene, said RGO or said GO are in a form of nanosheets.

13. The method of claim 1, further comprising heating said dispersion to at least 70° C. then cooling said dispersion at a cooling at a rate of <50° C./hour to room temperature before said evaporating.

14. The method of claim 1, wherein a mass ratio of said conjugated material to said CNT or said graphene comprising structure is from 3 to 60.

15. A method of forming composite materials, comprising:
dispersing a conjugated polymer, a solvent for said conjugated polymer, and a plurality of carbon nanotubes (CNTs) or graphene comprising structures to form a dispersion, wherein said CNTs or said graphene comprising structures includes an outer surface, and
evaporating said solvent from said dispersion to form a CNT or graphene comprising conjugated composite material,
wherein said conjugated composite material comprises a plurality of at least partially crystalline supramolecular structures including at least a portion having said conjugated polymer non-covalently secured to said outer surface of said CNTs or said graphene comprising structures, and
wherein said supramolecular structures have an average length which extends outward in a length direction from said outer surface of said CNTs or said graphene comprising structures, wherein said average length is greater than an average width of said supramolecular structures.

16. The method of claim 15, further comprising casting said dispersion on a substrate before said evaporating.

17. The method of claim 15, wherein said conjugated composite material comprises a conjugated homopolymer or a block copolymer comprising at least one block of said conjugated polymer and at least one block of a non-conjugated polymer.

18. The method of claim 17:
wherein said conjugated polymer comprises poly(3-hexylthiophene) (P3HT) and said graphene comprising structure comprises reduced graphene oxide (RGO) monolayers, and
wherein following said evaporating, said P3HT forms nanowires that grow from said RGO monolayers, and connect respective ones of said RGO monolayers.

19. The method of claim 15, further comprising heating said dispersion to at least 70° C. then cooling said dispersion at a cooling at a rate of <50° C./hour to room temperature before said evaporating.

20. The method of claim 15, wherein a mass ratio of said conjugated composite material to said CNT or said graphene comprising structure is from 3 to 60.

* * * * *